(12) United States Patent
Noh (10) Patent No.: US 12,417,142 B2
(45) Date of Patent: Sep. 16, 2025

(54) METHOD OF OPERATING MEMORY FOR HAVING HIGH RELIABILITY AND MEMORY OF IMPLEMENTING THE SAME

(71) Applicant: NETSOL CO., LTD, Hwaseong-si (KR)

(72) Inventor: Yong Hwan Noh, Hwaseong-si (KR)

(73) Assignee: NETSOL CO., LTD (KR)

( * ) Notice: Subject to any disclaimer, the term of this patent is extended or adjusted under 35 U.S.C. 154(b) by 0 days.

(21) Appl. No.: 18/283,185

(22) PCT Filed: Nov. 28, 2022

(86) PCT No.: PCT/KR2022/018944
§ 371 (c)(1),
(2) Date: Sep. 20, 2023

(87) PCT Pub. No.: WO2024/101512
PCT Pub. Date: May 16, 2024

(65) Prior Publication Data
US 2025/0036519 A1    Jan. 30, 2025

(30) Foreign Application Priority Data
Nov. 7, 2022 (KR) .................. 10-2022-0146861

(51) Int. Cl.
*G06F 11/10* (2006.01)
(52) U.S. Cl.
CPC ................. *G06F 11/1004* (2013.01)
(58) Field of Classification Search
CPC .... G06F 3/0679; G06F 3/0655; G06F 3/0616; G11C 29/52; G11C 16/26; G11C 16/3418; G11C 29/808; G11C 29/42

USPC ......................................... 714/768
See application file for complete search history.

(56) References Cited

U.S. PATENT DOCUMENTS

| 7,366,822  | B2* | 4/2008  | Kwak ............... G11C 7/1066 |
|            |     |         | 365/230.06 |
| 9,589,674  | B2* | 3/2017  | Son ................ G06F 11/1048 |
| 10,198,221 | B2* | 2/2019  | Cha ................ G06F 3/0619 |
| 10,810,080 | B2* | 10/2020 | Chung .............. G06F 3/0659 |
| 2009/0103356 | A1 | 4/2009  | Mokhlesi |
| 2012/0311407 | A1* | 12/2012 | Lee ................ G06F 11/1048 |
|            |     |         | 714/768 |
| 2014/0136925 | A1* | 5/2014  | Joo ................ G06F 11/1068 |
|            |     |         | 714/764 |
| 2017/0147433 | A1* | 5/2017  | Shinbashi .......... G06F 12/16 |

(Continued)

FOREIGN PATENT DOCUMENTS

| KR | 20120132765 A | 12/2012 |
| KR | 20140062332 A | 5/2014 |

(Continued)

*Primary Examiner* — Albert Decady
*Assistant Examiner* — Grace V Braden
(74) *Attorney, Agent, or Firm* — Renaissance IP Law Group LLP (57) ABSTRACT

An operating method of a memory which can achieve high data reliability and a memory implementing the operating method are disclosed. In the event of errors in data stored in cells, the data is corrected using parity during a read operation. However, since the data with errors is stored in the cells, the data is corrected while the read operation is activated. This process ensures the reliability of the data.

13 Claims, 6 Drawing Sheets

(56) References Cited

U.S. PATENT DOCUMENTS

2021/0158886 A1* 5/2021 Kim ..................... G11C 29/42
2023/0273860 A1* 8/2023 Hwang ............... G06F 11/1048

FOREIGN PATENT DOCUMENTS

| KR | 20180086815 A | 8/2018 |
|----|---------------|--------|
| KR | 20190090472 A | 8/2019 |

* cited by examiner

METHOD OF OPERATING MEMORY FOR HAVING HIGH RELIABILITY AND MEMORY OF IMPLEMENTING THE SAME

TECHNICAL FIELD

The present inventive concept relates to an operating method of a memory and a memory implementing the operating method, and more particularly, to an operating method of a memory with high data reliability and a memory implementing the same.

BACKGROUND ART

Various types of memories have their unique structures, each requiring specific manufacturing processes to realize its structure. Memories with distinct structures have operating characteristics derived from their respective structures and processes, leading to various issues in data writing and reading operations. In particular, there are reliability issues related to long-term data retention.

For example, static random access memory (SRAM) has a latch structure and faces issues with reduced noise margin due to process, voltage, and temperature (PVT) variations. Moreover, it encounters errors caused by disturbances such as spacecraft. The reduced noise margin and disturbances can lead to a phenomenon called "flip", where the level of stored data is inverted.

Dynamic random access memory (DRAM) is composed of a capacitor that stores charges and a cell transistor that acts as a path for the stored charges. In the DRAM, variations in the threshold voltage of the cell transistor and heat can lead to a leakage current. The leakage current results in the loss of charge stored in the capacitor, which, in turn, results in data loss.

Furthermore, the cell of ferroelectric random access memory (FRAM) is composed of a ferroelectric material, and the polarization degradation occurs due to a fatigue phenomenon caused by frequent changes in the polarization direction of the ferroelectric and an imprint phenomenon caused by long-term polarization in the same direction. The polarization degradation also occurs due to thermal effects. The polarization degradation results in data loss in FRAM.

In a flash memory, the repeated program and erase operations cause degradation of a tunnel insulation layer in a cell, and the erase operation leads to a change in the threshold voltage. As a result, different threshold voltages are distributed among the cell transistors, and the variation in threshold voltage increases. The degradation of the tunnel insulation layer and the increased variation in the threshold voltage lead to data loss.

Magnetic random access memory (MRAM) may encounter errors during the write operation on ferromagnetic layer, and unstable factors and external magnetic fields may cause data loss during the read operation.

As described above, memories have various issues that can lead to loss of stored data due to a range of causes. To solve these issues, an error correction code engine is provided. The error correction code engine refers to a circuit that stores data and parity in a memory address and uses the parity to correct error bits in the data. The error correction code engine adopted in the memory has an error correction capability, which refers to the maximum number of error bits that can be corrected within the data. A higher error correction capability results in an improved reliability of the data stored in and retrieved from the memory. However, as the number of parities required for error correction increases, the size of the error correction code engine increases, resulting in an increased chip area. Accordingly, a memory designer selects the length of parity to match the type of memory and the desired level of reliability and implements the error correction capability accordingly.

However, in a non-volatile memory, various factors such as external magnetic fields and disturbance noise can increase the probability of data loss over time. This phenomenon occurs due to continuous use of memory, and it leads to error bits that exceed the error correction capability set by the designer. Consequently, normal error correction operation cannot be performed in the memory with the error correction code engine, resulting in erroneous data during the read operation.

DISCLOSURE

Technical Problem

A first technical problem to be solved by the present inventive concept is to provide an operating method of a memory which activates a read command applied from the outside of the memory to correct errors during a read operation.

A second technical problem to be solved by the present inventive concept is to provide a memory which can regenerate a parity using a write path that is not used during the read operation and update data in a cell.

Technical Solution

The present inventive concept for solving the first technical problem provides an operating method of a memory, comprising: outputting a code word consisting of data and parity from cells assigned to the address by activating a read path according to a read command and an address; outputting corrected data, in which errors of the data are corrected using the parity, and the number of error bits; comparing the number of error bits with a reference number of error bits; inputting the corrected data to a write path by activating the write path depending on the result of the comparison; generating a corrected code word by generating a new parity for the corrected data input to the write path; and writing the corrected code word in the cells assigned to the address.

The first technical problem of the present inventive concept is also achieved by providing an operating method of a memory, comprising: receiving a read command and a start address; activating an internal read command based on the read command and generating a first address that is an internal address based on the start address; outputting a first code word consisting of first data and a first parity from cells assigned to the first address; outputting first corrected data in which errors are corrected and a first number of error bits by performing error correction decoding on the first data of the first code word; comparing the first number of error bits of the first code word with a reference number of error bits according to the error correction decoding; outputting the first corrected data to the outside of the memory depending on the result of the comparison, inputting the first corrected data to a write path to perform error correction encoding, and generating a first corrected parity corresponding to the first corrected data; and writing a first corrected code word consisting of the first corrected data and the first corrected parity in the cells assigned to the first address.

The present inventive concept for solving the second technical problem provides a memory comprising: a cell array with a plurality of cells disposed therein; an access unit that accesses the cell array to write or output a code word consisting of data and parity in or to cells assigned to an address supplied to the cell array; a read path that is connected to the access unit to generate corrected data by performing error correction on the data output from the cells and to generate the number of error bits using the parity; an update command control unit that receives the number of error bits from the read path and compares the number of error bits with a reference number of error bits to generate an update write command for activating a write path within a period during which a read command is activated; a write path that is connected to the access unit and disposed in parallel with the read path to selectively receive the corrected data in response to the update write command and generate a corrected parity to output a corrected code word to the access unit; and an input/output circuit that is connected to the read path and the write path to receive the corrected data output from the read path and output the corrected data to the outside of the memory.

Advantageous Effects

According to the present inventive concept as described above, the correction of data with errors is performed within a period during which a read operation for cells assigned to a single address is performed, and corrected data is output to the outside of the memory. Moreover, the corrected data is input to a write path within a period during which the read operation is performed to form a corrected code word along with an updated parity, and the corrected code word is then written in the cells assigned to the address during the read operation within a period during which a read command is activated. That is, the correction of data is performed for each read operation, and the corrected data is written in the cells of the memory. Thus, the reliability of data is significantly improved.

BEST MODE FOR CARRYING OUT THE INVENTION

As the present inventive concept allows for various changes and numerous embodiments, particular embodiments will be illustrated in the drawings and described in detail in the written description. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the drawings, like reference numerals have been used throughout to designate like elements. Unless defined otherwise, all terms used herein including technical or scientific terms have the same meaning as those generally understood by those skilled in the art to which the present inventive concept pertains. It will be further understood that terms defined in dictionaries that are commonly used should be interpreted as having meanings that are consistent with their meanings in the context of the relevant art and should not be interpreted as having ideal or excessively formal meanings unless clearly defined in the present application.

Hereinafter, preferred embodiments of the present inventive concept will be described in more detail with reference to the accompanying drawings.

First Embodiment

Figure 1:
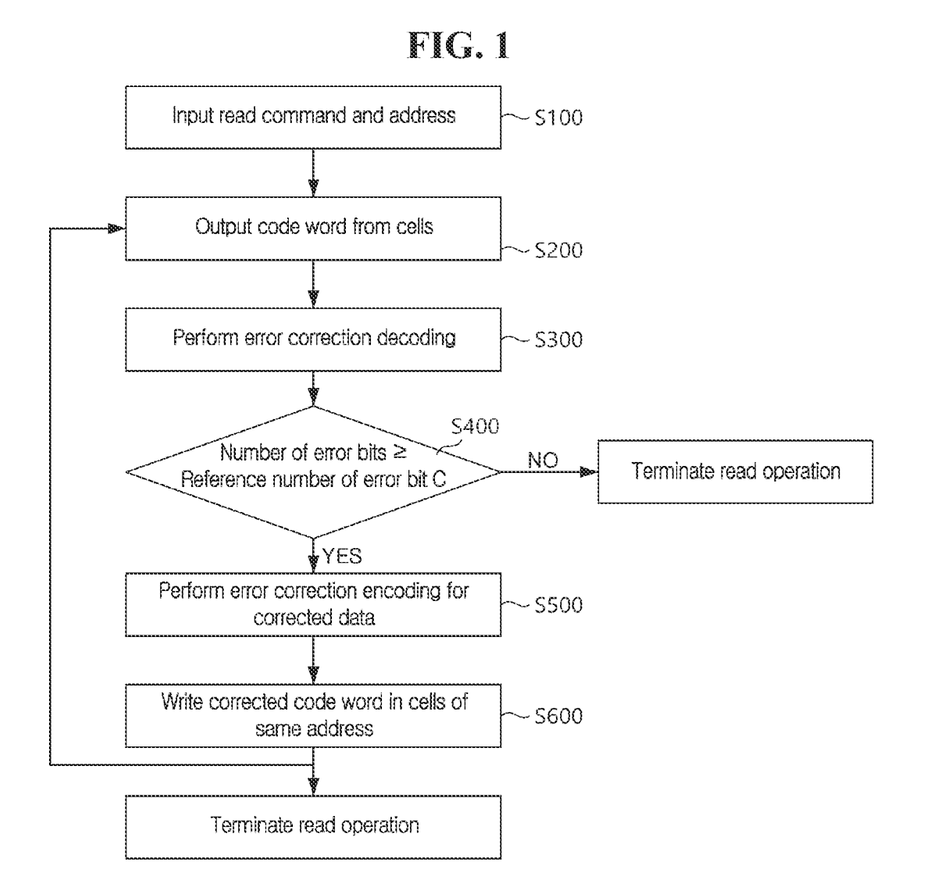
FIG. 1 is a flowchart illustrating an operating method of a memory according to a first embodiment of the present inventive concept.

FIG. 1 is a flowchart illustrating an operating method of a memory according to a first embodiment of the present inventive concept.

Referring to FIG. 1, a read command and an address are input to a memory (S100). If the read command is input, the memory activates a read path, and a plurality of modules or circuits that form the read path start to operate.

Moreover, the term "activation" as used herein refers to the state in which the corresponding circuit or block can process an input signal or data, indicating that the circuit or block is in its normal operating state.

By the activation of the read path, a code word is output from cells assigned to a specific address in a cell array to the read path (S200). The cell array has a matrix structure where multiple cells as unit storage elements are arranged. The code word consists of data of k bits (where k is a natural number greater than or equal to 1) and parity of p bits (where p is a natural number greater than or equal to 1).

The data refers to binary data containing information desired by a user in the read and write operations, and the parity, as is commonly known to those skilled in the art, is an error identifier added to the data to detect errors in the data.

For setting the parity, conventional techniques well known to those skilled in the art are employed. For example, if the data is 32 bits, the parity may consist of 12 bits, and various types of parity may be set based on the data error correction method and error correction capability. However, the method of setting the parity is not a critical element of the present inventive concept, and conventional methods commonly used in the art are employed.

In the present inventive concept, the parity can be used not only to correct errors in the data, but also to determine the number of error bits in a code word through digital processing of the parity. That is, the parity can be used to determine the number of error bits of the code word.

Furthermore, it should be understood that the term "read operation" refers to the process where data is output from the cell array to the read path.

Subsequently, an error correction decoding operation is performed on the code word output from the cell array (S300). The error correction decoding operation refers to the process of using the parity to determine an error occurred in the code word and correct the data error. There may be data errors and parity errors within the code word. Through error correction decoding, the number of error bits of the code word can be determined, and the data errors in the code word are corrected.

Data with errors in the code word is corrected by the parity and updated to error-free corrected data. In addition, the number of error bits in the code word is also determined through the error correction decoding operation. If no errors are present in the code word, no correction operation is needed for the data, however, for the sake of description, the data that goes through the error correction decoding operation is referred to as corrected data.

Therefore, the term "corrected data" refers to the data that has undergone the error correction decoding operation, and it may be the same as the data stored in a cell or may be different from the data stored in the cell by an error correction operation.

The allowable number of error bits corresponds to the error correction capability and refers to the maximum number of error bits m that can be corrected by the parity. Moreover, in the present inventive concept, a reference number of error bits c is set. The reference number of error bits c may be set to a value greater than or equal to 1 through an external input terminal and may be set to a fixed value in the memory during the design step.

Setting the reference number of error bits c to a fixed value in the memory can be implemented through various methods. For example, the reference number of error bits may be set by programming a data value of a non-volatile memory such as one-time programmable (OTP) or multi-times programmable (MTP) memory.

The number of error bits is determined by the error correction decoding operation, and the number of error bits is compared with the reference number of error bits c (S400). The number of error bits refers to the number of errors resulting from the flip of binary numbers included in the data and parity. However, during the error correction decoding, the number of error bits is determined, and corrected data according to the correction of the data is generated.

If the number of error bits is smaller than the reference number of error bits c, the corrected data is output to the outside of the memory, and the path through which the corrected data is written in the cell array is also blocked. As a result, there will be a difference between the data stored in the cells assigned to a specific address and the corrected data being output to the outside of the memory.

If the number of error bits is greater than or equal to the reference number of error bits c, a write operation for the corrected data is performed.

In this embodiment, the output of the corrected data is performed independently of the operation of determining the number of error bits. That is, the corrected data generated by the error correction decoding operation is output from the memory regardless of the operation of determining the number of error bits.

The write operation for the corrected data is performed while the read command is activated, and the corrected data is input from the read path to the write path.

In the write path, an error correction encoding operation for the corrected data is performed (S500). A new parity corresponding to the corrected data is generated by the error correction encoding operation, which is named corrected parity. That is, no correction operation is performed on the corrected data, and the parity is newly regenerated. The corrected data and the corrected parity together form a corrected code word. The corrected code word generated through the error correction encoding operation is written in the cells corresponding to the address specified in the initial reading step (S600). This process allows the data having error bits greater than or equal to the reference number of error bits c to be corrected and updated in the memory cells. Once the corrected code word is written in the memory cells, the read operation for the cells of the specific address is terminated. Moreover, according to an embodiment, a second read operation may be performed for the initial address where the corrected code word has been written. During the second read operation, the error correction decoding operation is performed on the corrected data, the number of error bits is determined again, and the iterative process of comparing the number of error bits with the reference number of error bits c may be performed. This process allows for a second update operation on the code word. The number of updates for the code word may be arbitrarily set based on the designer's intention and requirements. The second read operation is represented by the dotted line in FIG. 1.

In the description of FIG. 1, the corrected code word is generated within a period during which the read operation for a specific address is performed and is then written in the cells of the address where the read operation has been performed. This process allows the corrected data to be written in the cell. The generation of the corrected code word and the write operation are performed by an update write command generated within the memory while the address is activated. The update write command is generated by the comparison between the number of error bits and the reference number of error bits c. That is, if it is determined that the number of error bits is greater than or equal to the reference number of error bits c, the update write command is activated.

Figure 2:
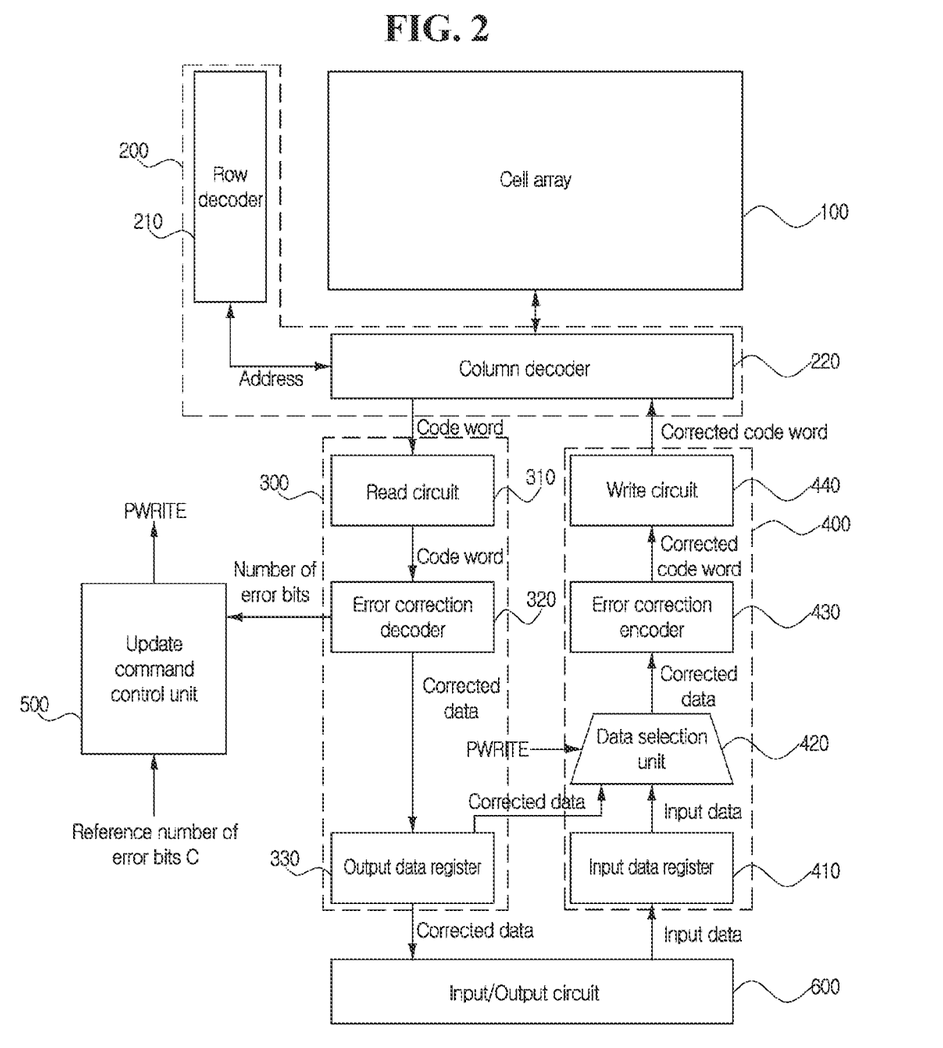
FIG. 2 is a block diagram of a memory for performing the operating method of FIG. 1 according to the first embodiment of the present inventive concept.

FIG. 2 is a block diagram of a memory for performing the operating method of FIG. 1 according to the first embodiment of the present inventive concept.

Referring to FIG. 2, the memory has a cell array 100, an access unit 200, a read path 300, a write path 400 and an update command control unit 500.

The cell array 100 has a structure where multiple memory cells are arranged in a matrix form. Each of the cells is connected to a word line and a bit line. The word line is used to select or activate the connected cell, and the bit line is used to input and output data to and from the cell. Depending on the type of memory, a source line may be added in addition to the word line and the bit line. The source line is opposite to the bit line around the cell and may be used to apply a read voltage or a write voltage for data input and output. Furthermore, the source line is preferably connected to a column decoder.

Specific word line and bit line are activated by an address supplied to the cell array, and the write operation and the read operation may be performed on a cell connected to the activated word line and bit line.

The access unit 200 has a row decoder 210 and a column decoder 220. An address is applied to the cell array through the access unit 200, and the cells corresponding to the designated address are activated. Moreover, depending on the read command or the write command applied through the row decoder 210 or the column decoder 220, the code word are is either output from the cells or written in the cells.

If the read command and the address are applied, the code word corresponding to the address is output through the column decoder 220 of the access unit 200. The code word is input to the read path 300.

The read path 300 comprises a read circuit 310, an error correction decoder 320 and an output data register 330. In the read path 300, the code word output from the cells is amplified, and the error correction decoder 320 performs the error correction decoding operation on the data. As previously mentioned, the error correction decoding operation is the process of using the parity included in the code word to correct the errors in the data to generate the corrected data and determine the number of error bits.

The read circuit 310 of the read path 300 is connected to the column decoder 220 to receive the code word and amplify the received code word to a level suitable for digital signal processing. To this end, the read circuit 310 comprises a sense amplifier, and the code word amplified through the read circuit 310 is input to the error correction decoder 320.

The error correction decoder 320 performs an error correction operation on the data and determines the number of error bits of the code word. Thus, data with errors is corrected to generate error-free corrected data. Moreover, the number of bits with errors in the code word is represented as the number of error bits. The error correction operation is the process of using the parity to determine and correct the error bits in the data. The parity takes different forms depending on the type of data. The parity may not correspond to the corrected data generated by the correction operation. However, the generation of a new parity or the correction of the parity may not be performed in the error correction decoder 320.

Furthermore, as described with reference to FIG. 1, the data output from the error correction decoder 320 is called the "corrected data". If there are no errors in the data, the corrected data has the same value as the data input to the error correction decoder 320. Whereas, if there are errors in the data, the corrected data has a different value from the data input to the error correction decoder 320.

The corrected data generated by the error correction decoder 320 is input to the output data register 330, and the corrected data stored in the output data register 330 is applied to an input/output circuit 600 and a data selection unit 420. The corrected data input to the input/output circuit 600 is output to the outside of the memory.

The number of error bits generated by the error correction decoder 320 is input to the update command control unit 500. If the number of error bits is input to the update command control unit 500, the number of error bits is compared with the preset reference number of error bits c. If the number of error bits is greater than or equal to the reference number of error bits c, the update command control unit 500 activates the update write command PWRITE. The update write command PWRITE is not a command applied to the memory from the outside, rather, it is an internal command generated by the update command control unit 500, which is an internal block of the memory. That is, the update write command PWRITE corresponds to an internal command generated and operated within the memory while the read command is activated.

The write path 400 is activated by the activated update write command PWRITE. The update write command PWRITE is applied to a control terminal of the data selection unit 420, and the data selection unit 420 selects corrected data from the output data register 330 in response to the update write command PWRITE.

The write path 400 has an input data register 410, a data selection unit 420, an error correction encoder 430, and a write circuit 440. Similar to the read path 300, the write path 400 is disposed between the column decoder 220 of the access unit 200 and the input/output circuit 600, and is disposed in parallel with the read path 300.

If there are no errors in the data of a specific address of the cell array, the write path 400 is deactivated and does not operate while the read command is activated. However, if an error occurs in the data and the update write command PWRITE is activated, the write path 400 is activated. That is, if the update write command PWRITE is activated, the write path 400 is also activated while the read path 300 is activated.

On the contrary, if a write command is input from the outside of the memory, only the write path 400 is activated and the read path 300 is deactivated. That is, data is input to the input data register 410 through the input/output circuit 600. If the update write command PWRITE is deactivated, the data selection unit 420 selects input data, and the selected input data is input to the error correction encoder 430. The error correction encoder 430 generates an input parity corresponding to the input data to generate an input code word. The input code word is written in the cells of the address applied to the access unit 200.

However, if the write command and the update write command PWRITE are simultaneously input to the data selection unit 420, it is preferable that the data selection unit 420 preferentially selects the update write command PWRITE and transmits the corrected data to the error correction encoder 430.

If the update write command PWRITE is activated, the write path 400 receives the corrected data and generate a corrected parity to output a corrected code word. The corrected code word is written in the cells corresponding to the existing address through the access unit 200. This process allows the update of the corrected data to be performed during the read operation.

The data selection unit 420 selects corrected data stored in the output data register 330 in response to the activated update write command PWRITE and outputs the corrected data to the error correction encoder 430.

The error correction encoder 430 receives the corrected data and generates a new parity corresponding thereto. The generated parity is called the "corrected parity", which is combined with the corrected data to generate a corrected code word. The generated corrected code word is input to the write circuit 440.

The write circuit 440 applies a constant voltage level to the corrected code word applied in the form of a digital signal. The row decoder 210 of the access unit 200 activates the selected word line, and the column decoder 220 applies the corrected code word to the selected data line (i.e., the bit line or source line). That is, the corrected code word is written in the memory cells of an address specified during the read operation, the data having error bits greater than or equal to the reference number of error bits is corrected, and the corresponding parity is also updated to the corrected parity.

Figure 3:
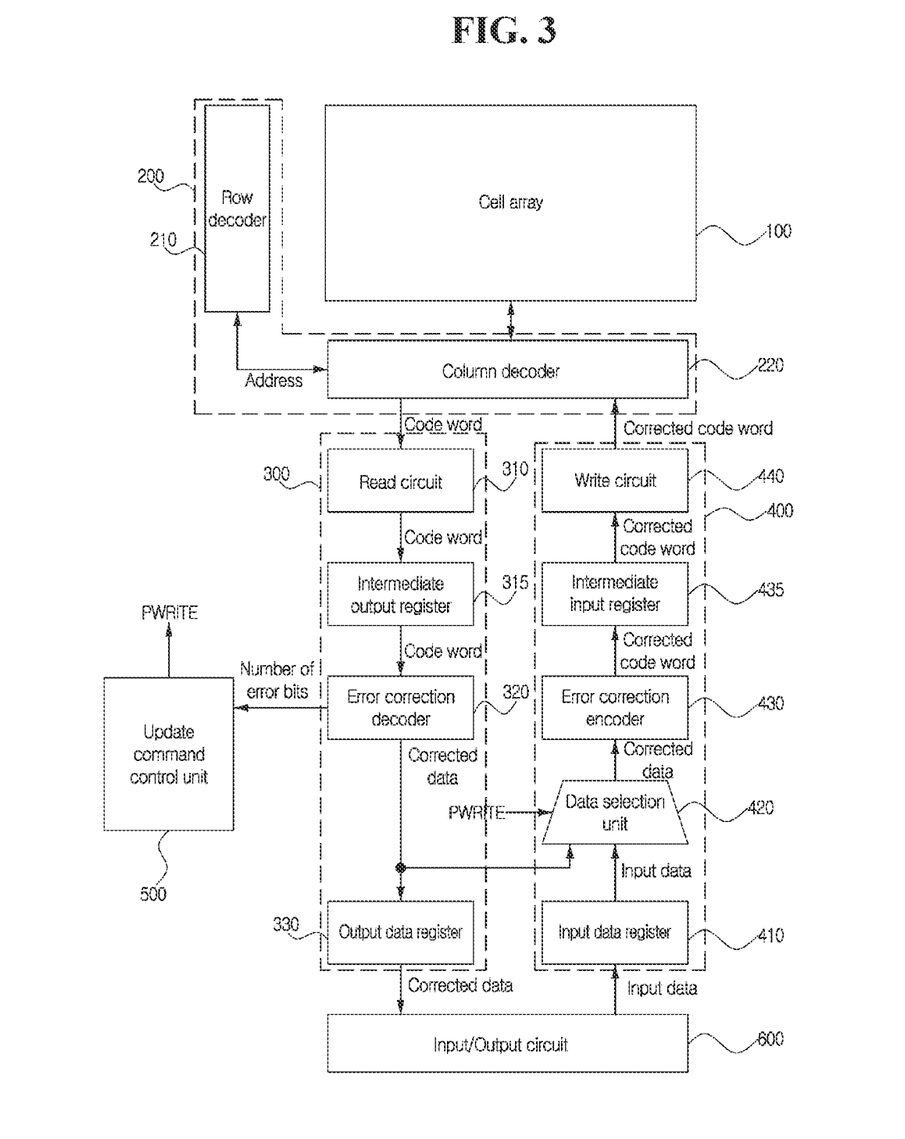
FIG. 3 is a timing diagram illustrating the operation of the memory of FIG. 2 according to the first embodiment of the present inventive concept.

FIG. 3 is a timing diagram illustrating the operation of the memory of FIG. 2 according to a preferred embodiment of the present inventive concept.

Referring to FIGS. 2 and 3, the maximum number of error bits m is set to 2, and the reference number of error bits c is set to 1. It is assumed that a first code word stored in the memory cells of a first address A1 has a 1-bit error, a second code word stored in the cells of a second address A2 has no bit error, and a third code word stored in the cells of a third address A3 has a 2-bit error.

First, a first read command is activated, and the first address A1 is applied. The read operation is initiated by the first read command, and the column decoder 220 and the row decoder 210 of the access unit 200 activate the word line to activate the cells corresponding to the first address A1 and perform a column selection operation.

The first code word output from the cells corresponding to the first address A1 consists of first data and a first parity, which is output from the cells by the read operation according to the first read command.

Subsequently, the first code word is input to the error correction decoder 320 through the read circuit 310, and the error correction decoder 320 performs the error correction operation on the first data. As described with reference to FIGS. 1 and 2, the number of error bits of the first code word is determined using the first parity, and the errors are corrected. Accordingly, the error correction decoder 320 outputs first corrected data in which errors are corrected. The first corrected data is a data bit reassigned to the first address A1. A first number of error bits determined by the error correction operation is 1, which is input to the update command control unit 500.

The update command control unit 500 compares the reference number of error bits c with the first number of error bits. In FIG. 3, the first number of error bits is greater than or equal to 1, which is the reference number of error bits, and thus the update command control unit 500 activates the update write signal PWRITE.

An update write operation is performed on the cells of the first address A1 while the first read command is activated by the activation of the update write signal PWRITE. The first corrected data is selected by the data selection unit 420 and the selected first corrected data is input to the error correction encoder 430.

The error correction encoder 430 generates a first corrected parity that is a new parity corresponding to the first address A1. Accordingly, the error correction encoder 430 generates a first corrected code word consisting of the first corrected data and the first corrected parity and outputs the first corrected code word to the write circuit 440. The first corrected code word that has passed through the write circuit 440 and the column decoder 220 is written in the cells of the first address A1. Accordingly, the pre-stored first code word is updated to the first corrected code word.

Subsequently, a second read command is activated, and the read operation for the second address A2 is performed. The second code word stored in the cells of the second address A2 is outputted from the cells by the read operation. The second code word consists of second data and a second parity.

In the assumption of FIG. 3, the second code word stored in the cells of the second address A2 is in an error-free state. Accordingly, a second number of error bits determined through the error correction decoding operation is 0, and the error correction operation does not occur. However, for the convenience of description, it will be described that the second corrected data is output from the error correction decoder 320. The second corrected data has the same value as the second data.

Moreover, since the second number of error bits is 0, the update write command PWRITE of the update command control unit 500 is not activated. Accordingly, a new internal write command is not generated within a period during which the read command is activated, and the second corrected data is output only to the outside of the memory and is not input to the write path.

Then, a third read command is activated, and the third address A3 is input. A third code word consisting of third data and a third parity is stored in the cells of the third address A3. Along with the activation of the third read command, the third code word is output from the cells of the third address A3. The third data of the third code word has two errors.

The error correction decoder 320 performs the error correction operation using the third parity, and a third number of error bits is generated. The third number of error bits is 2, and the third number of error bits is output to the update command control unit 500. Moreover, third corrected data corrected by the error correction operation is output to the output data register 330.

The update command control unit 500 compares the third number of error bits with the reference number of error bits c. Depending on the result of the comparison, the update command control unit 500 activates the update write command PWRITE to supply the third corrected data to the write path 400. The data selection unit 420 of the write path 400 selects the third corrected data according to the update write command PWRITE and performs the write operation according to an internal command during a period in which the third read command is activated.

The error correction encoder 430 receiving the third corrected data generates a third corrected parity corresponding to the third corrected data and generates a third corrected code word. The generated third corrected code word is written in the cells corresponding to the third address A3.

A specific address is designated through the above-described operation, and during a period in which the read command is activated, not only the read path but also the write path can be activated. That is, the correction operation is performed on the data with errors within one read operation, and the corrected data and the corrected parity are written in the designated address. Accordingly, during the read operation on the cells corresponding to a specific address, the data with errors can be updated. This process allows the data errors to be corrected for each read operation unit, and the reliability of data can be greatly ensured.

Figure 4:
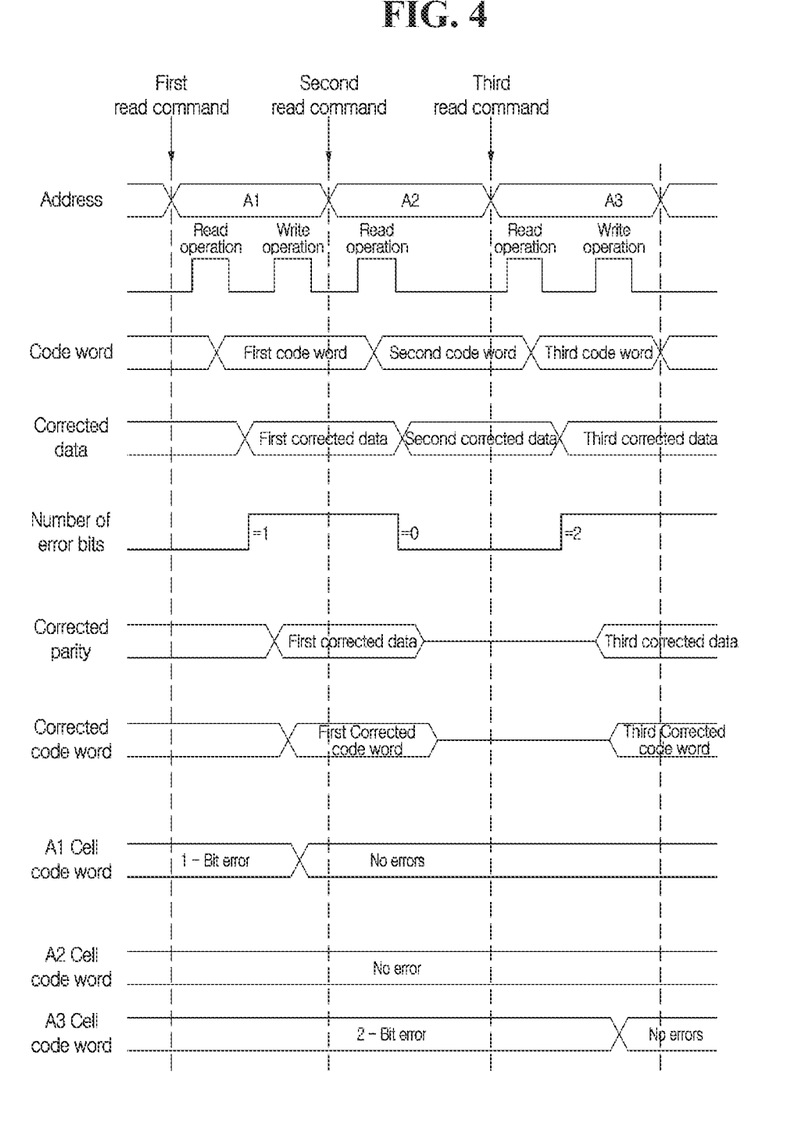
FIG. 4 is another block diagram of a memory according to the first embodiment of the present inventive concept.

FIG. 4 is another block diagram of a memory according to the first embodiment of the present inventive concept.

Referring to FIG. 4, within the read path 300, an intermediate output register 315 is further disposed between the read circuit 310 and the error correction decoder 320. Moreover, within the write path 400, an intermediate input register 435 is placed between the error correction encoder 430 and the write circuit 440.

Furthermore, the corrected data output from the error correction decoder 320 is also supplied to the data selection unit 420. In FIG. 2, the corrected data is stored in the output data register 330, and then the stored corrected data is supplied to the data selection unit 420; however, in FIG. 4, the corrected data output from the error correction decoder 320 is simultaneously supplied to the output data register 330 and the data selection unit 420.

Other features than the above-mentioned features are the same as those of FIG. 2 of the present embodiment. Moreover, the operations of the blocks shown in FIG. 4 are the same as those described in FIG. 2. However, the code word for which the read operation is performed for a specific address by the added intermediate output register 315 is temporarily stored, and it is configured to be easily synchronized with an internal clock.

In addition, in FIG. 2, the corrected data is stored in the output data register 330 and then applied to the data selection unit 420; however, in FIG. 4, the corrected data output from the error correction decoder 320 is input to the output data register 330 and also applied to the data selection unit 420 at the same time. The corrected data input to the output data register 330 is output to the outside of the memory through the input/output circuit 600, and upon the activation of the update write command PWRITE, the corrected data directly supplied from the error correction decoder 320 to the data selection unit 420 is selected by the data selection unit 420 and output to the error correction encoder 430.

Accordingly, the corrected data can be quickly input to the error correction encoder 430 along with the activation of the update write command PWRITE.

Second Embodiment

Figure 5:
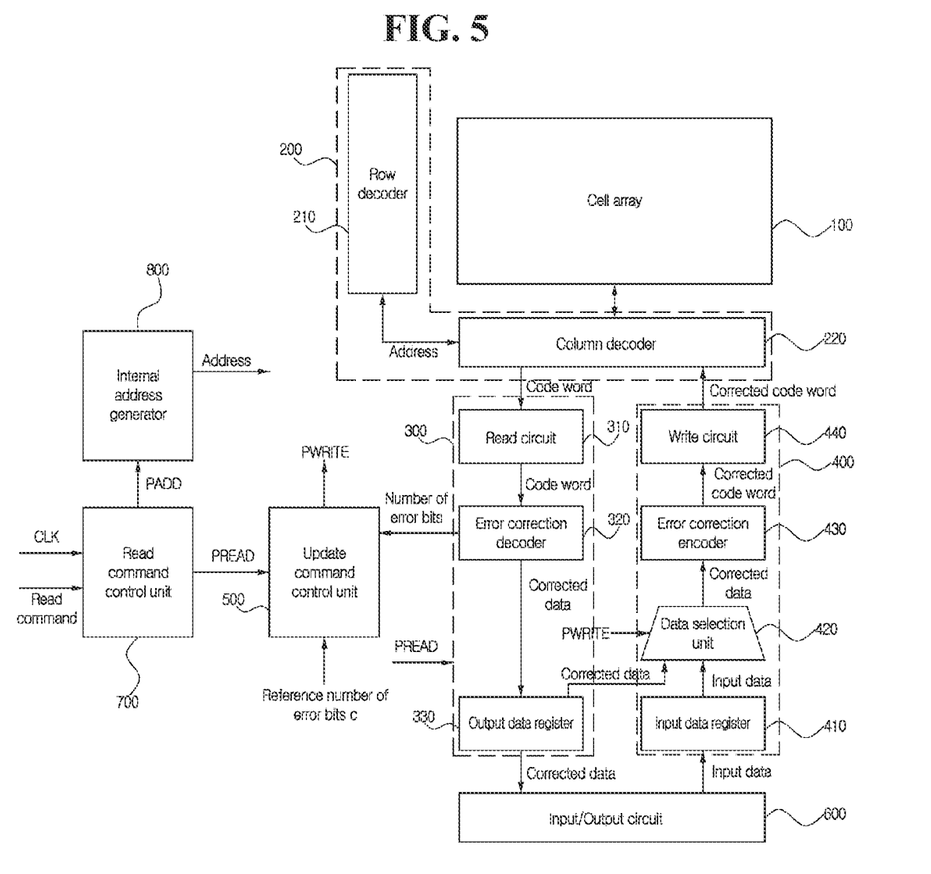
FIG. 5 is a block diagram of a memory according to a second embodiment of the present inventive concept.

FIG. 5 is a block diagram of a memory according to a second embodiment of the present inventive concept.

Referring to FIG. 5, the memory further comprises a read command control unit 700 and an internal address generator 800 compared to the memory of FIG. 2.

When a read command and a start address are input to the memory, the read command control unit 700 activates an internal read command PREAD and also activates an internal address command PADD. Moreover, the internal address generator 800 sequentially generates a first address, a second address, and a third address according to the internal address command PADD and the start address. That is, a plurality of addresses may be generated within the memory by a single read command, and the internal read operation for the corresponding addresses may be sequentially performed. The number of internal addresses sequentially generated by the start address may vary depending on the design or configuration of the internal address generator 800.

First, a clock signal CLK and a read command are input to the read command control unit 700. Also, a start address is input.

After the read command and the start address are input, the internal read command PREAD is activated, and the read path 300 is activated by the activated internal read command PREAD. Furthermore, if the read command is input, the read command control unit 700 activates the internal address command PADD, and the internal address command PADD is input to the internal address generator 800.

The internal address generator 800 receiving the internal address command PADD generates an internal address. The internal address command PADD is periodically and sequentially activated in response to the internal read command PREAD and input to the internal address generator 800. Accordingly, the internal address generator 800 periodically and sequentially generates the internal addresses, and the generated addresses are applied to the access unit 200.

If a plurality of internal read commands PREAD are generated by a single read command and the sequentially generated addresses are applied to the access unit 200, the read operation is initiated. If the internal read command PREAD is activated for the read operation, the read path is activated. A first code word consisting of first data and a first parity from the cells corresponding to the first address generated by the internal address generator 800 is input to the read path 300.

As mentioned in the first embodiment, the correction of the first data is performed by the error correction decoder 320, and the first corrected data is generated. In addition, the first number of error bits of the first code word consisting of the first data and the first parity is derived. However, the correction of errors included in the first parity is not performed in the error correction decoder 320.

The first number of error bits is input to the update command control unit 500 and compared with the reference number of error bits. Subsequent operations are the same as those described in the first embodiment. Accordingly, if the first number of error bits is less than the reference number of error bits, the first corrected data is outputted from the memory, and the update of the first code word stored in the cells of the first address does not occur. However, if the first number of error bits is greater than or equal to the reference number of error bits, the update command control unit 500 activates the internal read command PWRITE, and the internal read command PWRITE activates the write path 400.

The internal write command PWRITE is input to the data selection unit 420 in the write path 400, the data selection unit 420 selects the first corrected data, and the selected first corrected data is input to the error correction encoder 430.

The error correction encoder generates a first corrected parity that is a new parity corresponding to the received first corrected data. The first corrected data and the first corrected parity form a first corrected code word, which is written in the cells of the first address. This process allows for the update of the first code word in the cells of the first address.

After the first address is generated, the internal read command PREAD is activated again in synchronization with the clock signal CLK, and the internal address generator 800 generates a second address following the first address. The read operation is performed on the cells of the generated second address, and the error correction decoding operation on the second code word and the operation of comparing the number of error bits are performed according to the activation of the read path 300.

Figure 6:
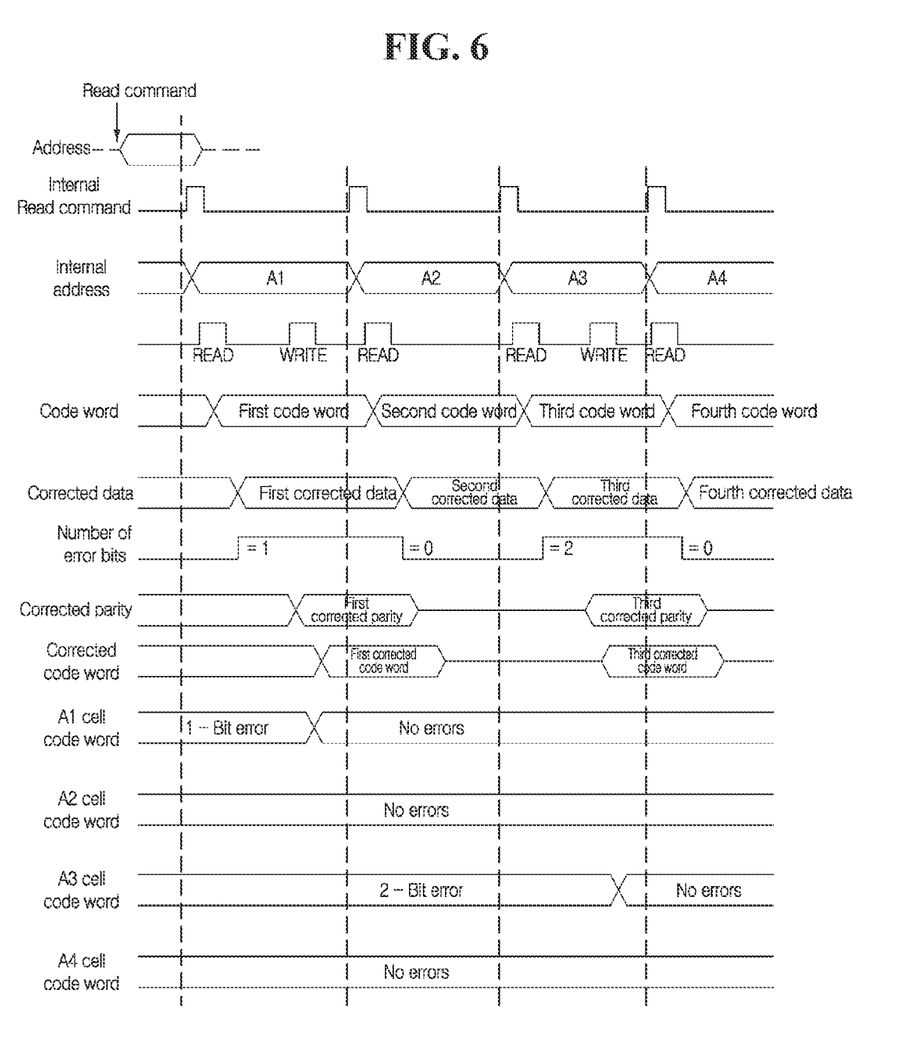
FIG. 6 is a timing diagram illustrating the operation of the memory of FIG. 5 according to the second embodiment of the present inventive concept.

In FIG. 5, if a single read command is applied, the internal read command PREAD and the internal address command PADD are periodically and sequentially generated, allowing the internal addresses to be sequentially generated. The correction operation on the code words for the cells corresponding to the generated internal addresses is performed. FIG. 6 is a timing diagram illustrating the operation of the memory of FIG. 5 according to the second embodiment of the present inventive concept.

Referring to FIGS. 5 and 6, the read command is applied from an external terminal of the memory. The start address is applied before or after the read command or at the same time.

The internal read command PREAD and the internal address command PADD are activated by the read command received from the read command control unit, and the internal address generator sequentially generates a plurality of internal addresses. In this embodiment, first to fourth addresses A1 to A4 are sequentially generated. Moreover, the received start address may be the same as the first address A1, but depending on the application, the start address and the first address A1 may have different values according to a predetermined algorithm.

The read and update operations on the code word disclosed in the first embodiment are performed by the applied read command and the internal address. However, in the second embodiment, a plurality of internal addresses are generated during the application of a single read command and during the read operation, and accordingly, the update operation on the code words assigned to the plurality of addresses is performed.

The read operation is initiated by the read command, and the internal read command PREAD and subsequent addresses are generated within the memory until the memory is deactivated.

It is assumed that the number of error bits in the first code word of the cells of the first address A1 is 1, the number of error bits in the second code word of the cells of the second address A2 is 0, the number of error bits in the third code word of the cells in the third address A3 is 2, and the number of error bits in the fourth code word of the cells in the fourth address A4 is 0. Moreover, it is assumed that the reference number of error bits set in the update command control unit 500 is 1.

The internal read command PREAD is activated in the read command control unit 700 by the read command. The read operation is initiated by the activated internal read command PREAD. In addition, the internal address generator 800 generates an internal address in response to the internal address command PADD generated by the read command control unit 700. The first address A1 is generated by the received start address. By the first address A1 and the internal read command PREAD, the column decoder 220 of the access unit 200 selects a column line, and the row decoder 210 activates a word line, initiating the read operation.

The first code word corresponding to the first address A1 is input to the error correction decoder 320 through the read circuit 310, and the error correction decoder 320 performs the correction operation on the first data using the first parity. The error correction decoder 320 outputs first corrected data and outputs the first number of error bits of the first code word including the first data and the first parity. The generated first number of error bits is 1, which is compared with the reference number of error bits in the update command control unit 500.

Since the first number of error bits is greater than or equal to the reference number of error bits having a value of 1, the update command control unit 500 activates the internal write command PWRITE. Thus, the write path 400 selects the first corrected data.

The first corrected data is input to the error correction encoder 430, and the error correction encoder 430 generates a first corrected parity and outputs a first corrected code word. The first corrected code word is written in the cells of the first address. This process allows for the update of the code word in the cells of the first address.

Moreover, the internal read command PREAD is periodically activated in synchronization with the clock signal CLK, and the internal address generator 800 generates the second address A2. Since it has been assumed that the number of error bits of the second code word assigned to the second address is 0, the second corrected data output from the error correction decoder 320 is the same as the second data forming the second code word. Furthermore, the update command control unit 500 does not generate or deactivates the internal read command PWRITE, and the write path 400 does not operate or is deactivated.

Following the second address A2, the third address A3 is generated in the internal address generator 800, and the internal read command PREAD is reactivated. In response to the internal read command PREAD, the access unit 200 outputs the third code word assigned to the third address A3 to the read path 300. The error correction decoder 320 determines the number of error bits in the third code word. It has been assumed that the third code word has two error bits. Moreover, in the third data and the third data that form the third code word, the errors in the third parity are corrected, resulting in third corrected data.

The third number of error bits having a value of 2 is compared with the reference number of error bits in the update command control unit 500, and the internal write command PWTIRE is activated. The error correction encoder 430 of the write path generates a third corrected parity corresponding to the third corrected data, and the third corrected code word is stored in the cells of the third address A3. This process allows for the update of the code word in the cells of the third address A3.

Following the third address A3, a fourth address A4 is generated by the internal address generator 800, and the read operation for the fourth address A4 is performed by the reactivated internal read command PREAD. The decoding operation is performed on the fourth code word input to the error correction decoder 320. The fourth code word consists of fourth data and a fourth parity, and it has been assumed that there is no error bit. Accordingly, the internal write command PWRITE is deactivated in the update command control unit 500, and fourth corrected data that is the same as the fourth data is output to the outside through the output data register 330.

In FIGS. 5 and 6, if a read command and a start address are applied, the internal addresses are sequentially generated within the memory without the application of a further read command, and the internal read command PREAD is periodically generated. Code words corresponding to the sequentially generated internal addresses are output, the error correction operation is performed on the data of the code words, and the update operation is performed on the code words having error bits greater than or equal to the reference number of error bits through a write path.

According to the present inventive concept as described above, the correction of the data with errors is performed within a period during which the read operation for the cells assigned to a single address is performed, and the corrected data is output to the outside of the memory. Moreover, the corrected data is input to the write path within a period during which the read operation is performed to generate a corrected code word along with the updated parity, and the corrected code word is then written in the cells assigned to the address during the read operation within a period during which the read command is activated. That is, the correction of the data is performed for each read operation, and the corrected data is written in the cells of the memory. Thus, the reliability of data is significantly improved.

The invention claimed is:

1. An operating method of a memory, comprising:
outputting a code word consisting of data and parity from cells assigned to an address by activating a read path according to a read command and the address;
outputting corrected data, in which errors of the data are corrected using the parity, and a number of error bits;
comparing the number of error bits with a reference number of error bits,
inputting the corrected data to a write path by activating the write path depending on the result of the comparison
generating a corrected code word by generating a new parity for the corrected data input to the write path; and
writing the corrected code word in the cells assigned to the address,
wherein if the number of error bits is greater than or equal to the reference number of error bits, an update write command is activated and the activated update write command is an internal command generated within the memory.

2. The operating method of a memory of claim 1, wherein the reference number of error bits is inputted from an external terminal of the memory.

3. The operating method of a memory of claim 1, wherein the reference number of error bits is set within the memory.

4. The operating method of a memory of claim 1, wherein the reference number of error bits is greater than or equal to 1 and less than or equal to a maximum number of corrected error bits of the code word, and wherein the maximum number of corrected error bits is the maximum number of error bits that can be corrected within the code word.

5. The operating method of a memory of claim 1, wherein the inputting the corrected data to a write path comprises:
receiving the activated update write command; and
selecting the corrected data in response to the update write command.

6. The operating method of a memory of claim 1, wherein the activation of the update write command is performed during a period in which the read command is activated.

7. The operating method of a memory of claim 1, wherein if the number of error bits is less than the reference number of error bits, the corrected data is output to the outside of the memory, and the write path does not select the corrected data.

8. An operating method of a memory, comprising:
receiving a read command and a start address;
activating an internal read command based on the read command and generating a first address that is an internal address based on the start address;
outputting a first code word consisting of first data and a first parity from cells assigned to the first address;
outputting first corrected data in which errors are corrected and a first number of error bits by performing error correction decoding on the first data of the first code word;
comparing the first number of error bits of the first code word with a reference number of error bits according to the error correction decoding;
outputting the first corrected data to an outside of the memory depending on the result of the comparison;
inputting the first corrected data to a write path to perform error correction encoding; and generating a first corrected parity corresponding to the first corrected data; and
writing a first corrected code word consisting of the first corrected data and the first corrected parity in the cells assigned to the first address,
wherein the inputting the first corrected data to the write path and the generating the first corrected parity are performed after the outputting the first corrected data to the outside of the memory, and
wherein after the first address is generated, subsequent internal addresses are sequentially generated by a single input of the read command.

9. A memory comprising:
a cell array with a plurality of cells disposed therein;
an access unit that accesses the cell array to write or output a code word consisting of data and parity in or to cells assigned to an address supplied to the cell array;
a read path that is connected to the access unit to generate corrected data by performing error correction on the data output from the cells and to generate the number of error bits using the parity;
an update command control unit that receives the number of error bits from the read path and compares the number of error bits with a reference number of error bits to generate an update write command for activating a write path within a period during which a read command is activated;
a write path that is connected to the access unit and disposed in parallel with the read path to selectively receive the corrected data in response to the update write command and to generate a corrected parity to output a corrected code word having the corrected data and the corrected parity to the access unit; and
an input/output circuit that is connected to the read path and the write path to receive the corrected data output from the read path and output the corrected data to the outside of the memory,
wherein the update write command is an internal command generated within the memory,
wherein the write path comprises:
an input data register for receiving and storing input data from the input/output circuit;
a data selection unit for selectively receiving the input data or the corrected data in response to the update write command;
an error correction encoder for receiving the corrected data output from the data selection unit and generating the corrected parity that is a new parity corresponding to the corrected data to generate the corrected code word; and
a write circuit for receiving the corrected code word from the error correction encoder and supplying the corrected code word to the access unit,
wherein if the number of error bits is greater than or equal to the reference number of error bits, the update command control unit activates the update write command, and
wherein the update write command is applied to the data selection unit, and if the update write command is activated, the data selection unit selects the corrected data.

10. The memory of claim 9, wherein the read path comprises:
a read circuit for activating a word line selected by a row decoder of the access unit and receiving and amplifying the code word from a data line selected by a column decoder;
an error correction decoder for receiving the amplified code word output from the read circuit and performing an error correction operation on the data using the parity; and
an output data register for receiving and storing the corrected data from the error correction decoder.

11. The memory of claim 10, wherein the error correction decoder outputs the corrected data and outputs the number of error bits in the data.

12. The memory of claim 9, further comprising:
a read command control unit for receiving a read command, supplying an internal read command to the read path, and generating an internal address command; and
an internal address generator for receiving the internal address command and sequentially generating a plurality of addresses based on a received start address.

13. The memory of claim 12, wherein the plurality of addresses are sequentially generated by a single application of the read command.

* * * * *